United States Patent
Fruhling

(12) 
(10) Patent No.: US 6,240,655 B1
(45) Date of Patent: Jun. 5, 2001

(54) FLUID EXCHANGE SYSTEM AND AN ASSOCIATED SPHERICAL-SHAPED SEMICONDUCTOR INTEGRATED CIRCUIT MANUFACTURING SYSTEM

(75) Inventor: Dirk Fruhling, Wylie, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/162,612

(22) Filed: Sep. 29, 1998

Related U.S. Application Data

(60) Provisional application No. 60/092,400, filed on Jul. 10, 1998.

(51) Int. Cl.[7] ........................................... F26B 3/08
(52) U.S. Cl. .................... 34/357; 34/366; 34/370; 34/374; 34/435
(58) Field of Search .................. 34/329, 330, 357, 34/360, 366, 370, 374, 438, 576, 578, 589, 61; 134/33, 37, 95.2; 118/715, 719, 725; 257/618, 531, 532

(56) References Cited

U.S. PATENT DOCUMENTS

| | | | |
|---|---|---|---|
| 3,262,213 | * 7/1966 | Austin et al. | 34/366 |
| 4,023,280 | * 5/1977 | Schora et al. | 34/364 |
| 4,307,773 | * 12/1981 | Smith | 34/589 X |
| 5,462,639 | 10/1995 | Matthews et al. | 156/662.1 |
| 5,782,011 | * 7/1998 | Boersen et al. | 34/366 |
| 5,946,818 | * 9/1999 | Baxter et al. | 34/379 |

FOREIGN PATENT DOCUMENTS 2-119241    10/1988    (JP).

* cited by examiner

Primary Examiner—Stephen Gravini
(74) Attorney, Agent, or Firm—Haynes and Boone, LLP

(57) ABSTRACT

A method for treating a descending process flow and a spherical-shaped semiconductor integrated circuit manufacturing system incorporating the same. The manufacturing system includes a first processing station, a second processing station and first and second intermediate stations positioned between the first and second processing stations. The first processing station produces, at an output thereof, a first process flow comprised of a first process fluid and spherical-shaped semiconductors. The output of the first processing station is coupled to a first downwardly descending tube which forms an input tube of the first intermediate station. The first process flow enters a porous tube positioned inside an evacuation chamber. A second process fluid is injected into the evacuation chamber through an inlet formed along a lower portion thereof and purges, through an outlet formed along an upper portion thereof, the first process fluid from the first process flow, thereby producing a second process flow comprised of the second process fluid and the spherical-shaped semiconductors. The second process flow enters a second downwardly descending tube which forms an output tube of the first intermediate station. The second downwardly descending tube passes through the second intermediate station which includes an outer housing, a radial wedge nozzle and a supply tube. The supply tube provides additional amounts of the second process fluid to the radial wedge nozzle which injects the additional amounts into the second process flow. From the second intermediate station, the second process flow downwardly descends to an input of the second processing station.

15 Claims, 1 Drawing Sheet

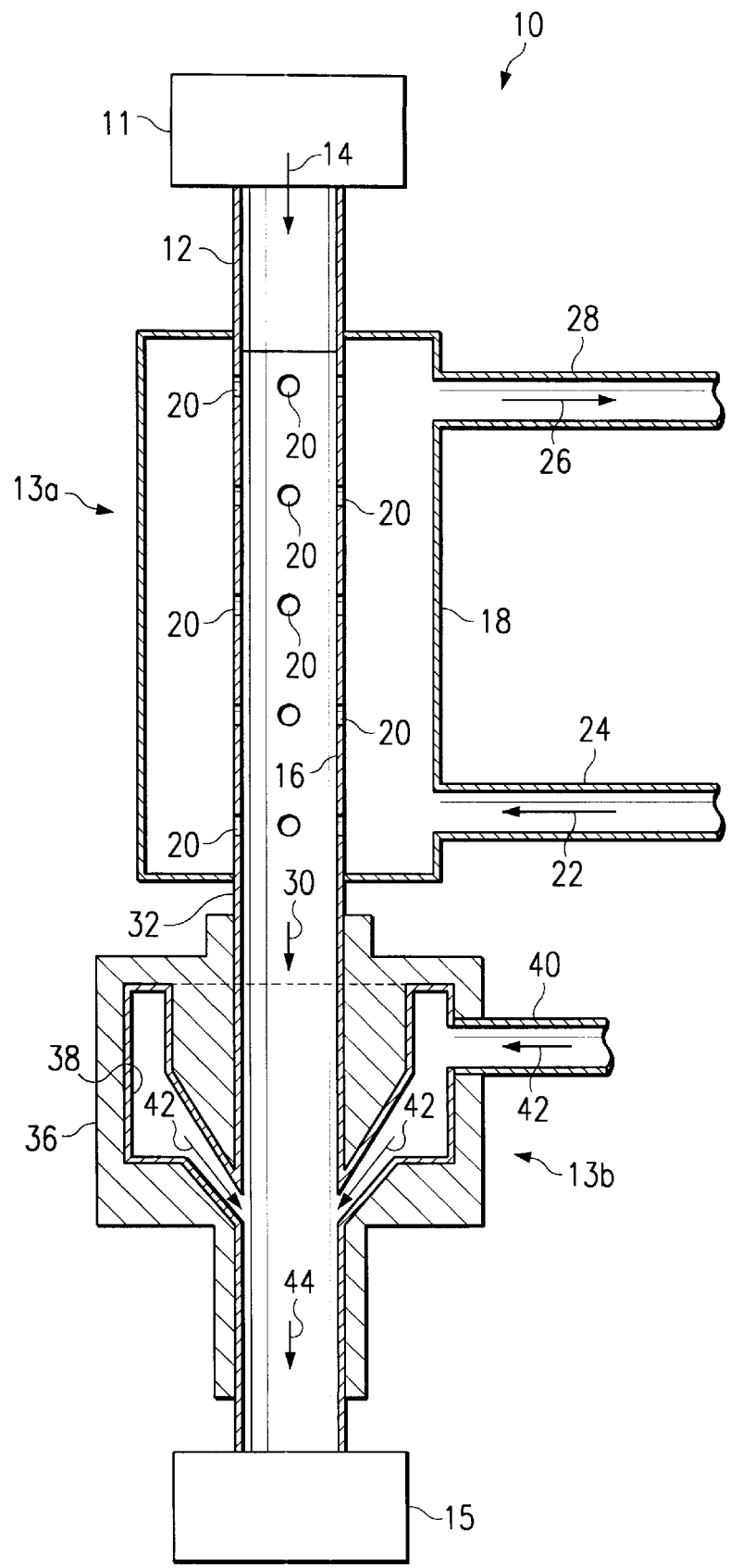

FLUID EXCHANGE SYSTEM AND AN ASSOCIATED SPHERICAL-SHAPED SEMICONDUCTOR INTEGRATED CIRCUIT MANUFACTURING SYSTEM

CROSS REFERENCE

This application claims the benefit of U.S. Provisional Application No. 60/092,400, filed Jul. 10, 1998.

BACKGROUND OF THE INVENTION

The invention relates generally to spherical-shaped semiconductor integrated circuit manufacturing systems, and more particularly, to a fluid exchange system, suitable for use in such manufacturing systems, for purging a first fluid from a process flow comprised of the first fluid and spherical-shaped semiconductors and injecting a second fluid into the process flow.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

A fabrication facility is relatively expensive due to the enormous effort and expense required for creating flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. In addition, the positioning and mounting steps are naturally two-dimensional in character, and therefore do not support curved or three dimensional areas.

Therefore, due to these and various other problems, only a few companies in the world today can successfully manufacture conventional flat chips. Furthermore, the chips must bear a high price to cover the costs of manufacturing, as well as the return on initial capital and investment.

In co-pending U.S. Pat. No. 5,955,776 filed on May 16, 1997, assigned to the same assignee as the present application and hereby incorporated by reference as if reproduced in its entirety, a method and apparatus for manufacturing spherical-shaped semiconductor integrated circuits is disclosed. As disclosed in the aforementioned patent application, the manufacturing process by which a spherical-shaped semiconductor integrated circuit is produced may include a variety of processing steps. Among these are: de-ionized water cleaning, developing and wet etching; diffusion, oxidation and deposition of films; coating; exposure; plasma etching, sputtering and ion implantation; ashing; and epitaxial growth. Many of these steps involve exposing a spherical-shaped semiconductor to a process fluid. For example, a film having a desired composition and thickness may be formed on the surface of the spherical-shaped semiconductors by exposing the spherical-shaped semiconductors to a first process fluid, typically, a gas, having a selected composition at a selected pressure and temperature. To ensure that formation of spherical-shaped semiconductor integrated circuits proceeds as designed, when such a process step is complete, it is often advisable to remove the first process fluid from further contact with the spherical-shaped semiconductors, for example, using a purging process. Failure to do so may result in unwanted chemical reactions, for example, the deposition of an overly thick layer of material, on the surface of the spherical-shaped semiconductors. Additionally, as the manufacturing process for spherical-shaped semiconductor integrated circuits often incorporates a multitude of processing steps such as the ones previously described, to aid in the efficiency of the manufacturing process and/or to assist in the transport of the spherical-shaped semiconductors between processing stations, it is often desirable to replace the removed process fluid with a second process fluid.

Further complicating the manufacturing process for spherical-shaped semiconductor integrated circuits are the special handling requirements which must be afforded the circuits during the manufacture thereof. Unlike conventional integrated circuits formed from flat surface semiconductor wafers, the spherical-shaped semiconductor integrated circuits produced from spherical-shaped semiconductors consume the entire surface area of the spherical-shaped semiconductors. Thus, unlike conventional integrated circuits which may be grasped along bottom or side surfaces thereof, grasping or otherwise contacting spherical-shaped semiconductor during the manufacturing process may result in significant damage thereto. Thus, many of the processing techniques used to manufacture conventional integrated circuits are unsuitable for use in the manufacture of spherical-shaped semiconductor integrated circuits.

Thus, it would be desirable to provide a fluid exchange system, capable of purging a first fluid from and injecting a second fluid into a process flow, suitable for use in spherical-shaped semiconductor integrated circuit manufacturing processes. It is, therefore, the object of the invention to provide such a fluid exchange system.

SUMMARY OF THE INVENTION

In one embodiment, the present invention is of a method for post-processing treatment of a descending output flow comprised of a first process fluid such as a first gas and particulate matter such as a spherical-shaped semiconductor material which is generated at a first processing station of a manufacturing system. A first, ascending, flow comprised of a second process fluid such as a second gas and having an ascending velocity greater than a descending velocity of the descending output flow is injected in opposition to the descending output flow. After contacting the descending output flow, the ascending flow is removed. After the descending output flow contacts the ascending flow, the ascending flow is comprised of the first process fluid and a first portion of the second process fluid and the descending output flow is comprised of a second portion of the second process fluid and the particulate matter. In one aspect thereof, a second flow of the second process fluid is injected into the descending output flow comprised of the second process fluid and the particulate matter, a second flow of the second process fluid. Preferably, the flow of the second process fluid injected into the descending output flow is evenly distributed along a periphery of the descending output flow. In another aspect thereof, the descending output flow into which the second flow of the second process fluid was injected is transported to a second processing station.

In a related embodiment, the present invention is of a method for pre-processing treatment of a first descending flow comprised of a first process fluid such as a first gas and particulate matter such as a spherical-shaped semiconductor material which is produced at a first processing station of a manufacturing system to produce a second descending flow comprised of a second process fluid such as a second gas and the particulate matter for transport to a second processing station configured for processing the second descending flow.

In accordance with further embodiments thereof, the present invention is of a manufacturing system and an associated spherical-shaped semiconductor integrated circuit manufacturing system which includes a first processing station, a second processing station and a first intermediate station positioned between the first and second processing stations. The first processing station produces, at an output thereof, a first process flow comprised of a first process fluid and at least one spherical-shaped semiconductor. The output of the first processing station is coupled to a first downwardly descending tube which forms an input tube of the intermediate station. At the intermediate station, the second process fluid is injected into the first process flow to purge the first process fluid therefrom, thereby producing a second process flow comprised of the second process fluid and the at least one spherical-shaped semiconductor. The second process flow enters a second downwardly descending tube which forms an output tube of the intermediate station and is coupled to an input of the second processing station.

In one aspect thereof, the intermediate station includes an evacuation chamber and a downwardly descending porous tube positioned in an interior portion of the evacuation chamber. An upper end of the porous tube is coupled to the first downwardly descending tube while a lower end thereof is coupled to the second downwardly descending tube. The second process fluid is injected into the evacuation chamber through an inlet formed along a lower portion thereof and purges, through an outlet formed along an upper portion thereof, the first process fluid from the first process flow.

In another aspect thereof, a second intermediate station is positioned between the first intermediate station and the second processing station. The second downwardly descending tube passes through the second intermediate station where additional amounts of the second process fluid are injected into the second process flow. Preferably, the second intermediate station includes an outer housing, a radial wedge nozzle and a supply tube. The second downwardly descending tube passes through an interior of the outer housing. The radial wedge nozzle is mounted to the housing, positioned in the interior thereof, and in communication with the second downwardly descending tube along a periphery thereof. The supply tube provides the additional amounts of the second process fluid to the radial wedge nozzle which injects the additional amounts into the process flow.

BRIEF DESCRIPTION OF THE DRAWING

The drawing illustrates a descending-type treatment device constructed in accordance with the present invention.

DESCRIPTION OF THE EMBODIMENTS

Referring to the drawing, the reference numeral 10 refers, in general, to a descending-type treatment device used to implement one or more steps of a manufacturing process. Typically, the descending-type treatment device 10 would form one portion of a larger manufacturing system. For example, the manufacturing system may be comprised of plural processing stations, first and second ones of which are shown in the drawing as processing stations 11 and 15, respectively. As disclosed herein, the first processing station 11 produces, as an output flow therefrom, a first process stream comprised of a first fluid and particulate matter while the second process station 15 receives, as an input flow thereto, a second process stream comprised of a second fluid and the particulate matter. In that the present invention may be used in combination with a wide variety of types of process stations, the particular reactive processes which respectively occur within the first and second process stations 11 are not of particular concern to the teachings of the present invention. In the embodiment of the invention disclosed herein, the first and second process stations 11 form part of a manufacturing system in which spherical-shaped semiconductor integrated circuits are fabricated using spherical-shaped semiconductors, the first fluid is a first gas, the second fluid is a second gas and the particulate matter is comprised of at least one spherical-shaped semiconductor. Further details as to the various steps in the fabrication process as well as the configuration of the various types of devices which may be used to perform such process steps are set forth in U.S. Pat. No. 5,955,776, the copending patent previously incorporated by reference.

As disclosed herein, the descending-type treatment device 10 transports an output flow 14 from the first process station 10 to the second process station 15 where it is provided to the second process station 15 as an input flow 44. Thus, the descending-type treatment device 10 functions as an intermediate stage of a larger processing system. However, it should be clearly understood that the descending-type treatment device 10 is equally suitable for use alone or with only one of the first and second process stations 11. For example, the descending-type treatment device 10 may function as a post-processing treatment device for processing an output flow produced by the first process station 11, whereby the output of the descending-type treatment device 10 is the final product of the processing system. Alternately, the descending-type treatment device 10 may function as a pre-processing treatment device for pre-processing a process fluid before it is supplied to the second process station 15, whereby processing of the fluid is commenced at the second process station 15. Furthermore, it should be clearly understood that, while the device 10 is a descending-type treatment device, in other words, a device in which a process fluid downwardly descends therethrough, typically, under the influence of gravity, while one or more processing steps are performed using the downwardly descending process fluid, such a limitation should, in no means, be construed to extend to the flow of process fluids into, within, or out of either of the first and second processing stations 11 or 15. For example, it is fully contemplated that, in one embodiment of the invention, a process fluid may laterally flow out of the first process station 11 and then be dropped through the downwardly descending-type treatment device 10, where, once exiting the downwardly descending-type treatment device 10, the process fluid laterally flows to the second process station 15.

In a broad sense, the descending-type treatment device 10 is comprised of first and second intermediate stages 13*a* and 13*b*. The first intermediate stage 13*a* receives, from the first process station 11, a first downwardly-descending process flow comprised of the first gas and at least one spherical-shaped semiconductor. Within the first intermediate stage 13*a*, the second gas is injected into the first process flow such that the first gas is purged therefrom. Exiting the first intermediate stage 13*a* as a downwardly descending output flow therefrom, is a second process flow comprised of the second gas and the at least one spherical-shaped semiconductor. The second process flow is supplied to a second intermediate stage 13*b* where additional amounts of the second gas are injected thereinto. Once supplemented with additional amounts of the second gas, the second process flow exits the second intermediate stage 13*b* where it is supplied to the second processing station 15.

Continuing to refer to the drawing, the specific configuration of the descending-type treatment device 10 disclosed herein shall now be described in greater detail. Entering the descending-type treatment device 10 through an input tube 12, and designated as reference numeral 14, is a combination of at least one spherical-shaped semiconductor and a first process fluid, preferably, a gas, which will hereafter be collectively referred to as fluid A. Under the influence of gravity, the input tube 12 feeds the combination of the spherical-shaped semiconductors and the first process fluid into a porous tube 16 positioned within an interior area of an evacuation chamber 18. To prevent damage to the spherical-shaped semiconductors, it is generally preferred that, as a process fluid containing spherical-shaped semiconductors flows within a tube, for example, the input tube 12, the flow of process fluid is controlled such that the spherical-shaped semiconductors do not contact the sidewalls of the tube. It is contemplated that contact between the spherical-shaped semiconductors and the sidewalls of the tube 12, as well as the sidewalls of the porous tube 16 and the exit tube 32, may be avoided using any one of the flow control techniques disclosed in co-pending U.S. Pat. No. 5,955,776 and previously incorporated by reference into the present application, the flow control technique disclosed in co-pending U.S. patent application Ser. No. 08/995,393 filed (based upon Japanese patent application 9-272295 filed Oct. 6, 1997) or another technique commonly known to those skilled in the art.

Spaced along the porous tube 16 are a series of relatively small apertures 20. Preferably, the apertures 20 are sized such that process fluids such as the gas included in the process fluid A may readily flow therethrough. It is further preferred that the apertures 20 are uniformly spaced in a pattern which extends along the surface of the porous tube 16 and is selected such that the process fluid A will enter the process tube 16 in a controlled flow which will perform the aforementioned purging and mixing operations without disrupting the downward descent of the spherical-shaped semiconductors. As the combination 14 of spherical-shaped semiconductors and the first process fluid downwardly descends through the porous tube 16, a second process fluid 22, hereafter referred to as fluid B, is injected into the evacuation chamber 18 through a supply tube 24 which opens into the interior of the evacuation chamber 18 in a lower portion thereof. The velocity of the second process fluid 22 drops as it enters the larger volume of the interior of the evacuation chamber 18. However, as the second process fluid 22 is continuously pumped into the evacuation chamber 18 through the supply tube 24, the second process fluid 22 will still be forced upward, through the interior of the evacuation chamber 18, where excess fluid 26 is forced out of the evacuation chamber 18 through an exhaust tube 28 which opens into the interior of the evacuation chamber 18 in an upper portion thereof. The second process fluid 22 will also be forced downwardly where it will be forced out of the evacuation chamber 18 via an outlet end of the porous tube 16.

As the second process fluid 22 is continuously injected into the evacuation chamber 18, the second process fluid 22 is forced through the porous tube 16 in which the spherical-shaped semiconductors and the first process fluid are downwardly descending under the influence of gravity. The continued injection of the second process fluid 22 will force the second process fluid entering the porous tube 16 to flow both upwardly and downwardly therein. Presuming, of course, that the molecular weight of the first and second process fluids are roughly similar, it is generally preferred that the second process fluid 22 is injected into the evacuation chamber 18 at a rate such that the portion of the process fluid 22 flowing upwardly through the evacuation chamber 18 will achieve a velocity greater than the velocity of the downwardly descending first process fluid. In this manner, the continued injection of the second process fluid 22 will stop the downward descent of the first process fluid and propel the first process fluid through the apertures 20 of the porous tube 16, upward through the evacuation chamber 18 and out through the exhaust tube 28. However, the rate of injection of the second process fluid 22 should not be set at a rate sufficient to cause the second process fluid 22 to achieve a velocity sufficient to either drive the downwardly descending spherical-shaped semiconductors back up the porous tube 16 or deflect the downwardly descending spherical-shaped semiconductors towards the sidewalls of the porous tube 16.

Thus, the excess fluid 26 being forced out of the exhaust tube 28 is a combination of the first process fluid A and the second process fluid B. In this manner, continuous injection of the second process fluid into the evacuation chamber 18 will effect purging of all of the first process fluid from the descending combined flow 14 of the spherical-shaped semiconductors and the first process fluid. Of course, fluids having greater molecular weights will require less of a velocity advantage to effectively redirect the first process fluid contained in the downwardly descending process flow to the exhaust tube 28.

After being forced into the porous tube 16 by the continual injection of additional amounts of the second process fluid 22 into the evacuation chamber 16, in addition to being forced back out through the apertures 20 together with the first process fluid A, the second process fluid B will also flow downwardly through the porous tube 16 such that the flow of material 30 exiting the evacuation housing 18 via the exit tube 32 is comprised of the spherical-shaped semiconductors and the second process fluid B.

As the spherical shaped semiconductors and the second process fluid B downwardly descend out of a lower end of the porous tube 16, the spherical-shaped semiconductors and the second process fluid, illustrated collectively in the drawing using reference numeral 30, then enter a second intermediate stage 13b where additional amounts of the second process fluid B are injected into the second process flow comprised of the combination of spherical-shaped semiconductors and the second process fluid B to boost the pressure and flow rate of the second process fluid B. The second intermediate stage 13b is comprised of an outer housing 36, a ring nozzle 38 and a high pressure supply tube 38. A pressurized flow 42 of the second process fluid B is supplied to the ring nozzle 38 via the supply tube 38. In turn, the ring nozzle 38, which opens into the exit tube 32 along the periphery thereof, injects the pressurized flow into the downwardly descending flow of spherical-shaped semiconductors and second process fluid 30. By injecting the pressurized flow 42 of the second process fluid along the periphery of the exit tube 32, the pressurized flow 42 will readily combine with the flow 30 of spherical-shaped semiconductors and second process fluid B without driving any of the downwardly descending spherical-shaped semiconductors contained within the flow 30 into the sidewalls of the exit tube 32.

Downwardly descending out of the exit tube 32 of the second intermediate stage 34 is a flow 44 comprised of spherical-shaped semiconductors and an increased amount of the second process fluid B. From the second intermediate stage 34, the flow 44 enters a second process stage 15 where a next processing step of the formation of a spherical-shaped semiconductor integrated circuit from the spherical-shaped semiconductors may be conducted.

It is understood that various modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. For a manufacturing system having a first processing station which generates a descending output flow comprised of a first process fluid and particulate matter, a method for post-processing treatment of said descending output flow, comprising the steps of:
    injecting, in opposition to said descending output flow, a first, ascending, flow comprised of a second process fluid and having an ascending velocity greater than a descending velocity of said descending output flow; and
    removing a second ascending flow after said first ascending flow contacts said descending output flow;
    wherein, after contact of said descending output flow and said first ascending flow, said second ascending flow is comprised of said first process fluid and a first portion of said second process fluid and said descending output flow is comprised of a second portion of said second process fluid and said particulate matter.

2. The method of claim 1 wherein said particulate matter is spherical-shaped semiconductor material.

3. The method of claim 2 wherein said first process fluid is a first gas having a first molecular weight and said second process fluid is a second gas having a second molecular weight greater than the first molecular weight.

4. The method of claim 1 and further comprising the step of injecting, into said descending output flow comprised of said second process fluid and said particulate matter, a second flow of said second process fluid.

5. The method of claim 4 wherein said second flow of said second process fluid injected into said descending output flow is evenly distributed along a periphery of said descending output flow.

6. The method of claim 5 wherein said particulate matter is spherical-shaped semiconductor material, said first fluid is a first gas and said second fluid is a second gas.

7. The method of claim 6 wherein a first process step is performed at said first processing station, said manufacturing system further comprises a second processing station and further comprising the step of transporting, to said second processing station, said descending output flow into which said second flow of said second process fluid was injected.

8. For a manufacturing system having a first descending flow comprised of a first process fluid and particulate matter and a first processing station configured for processing a second descending flow comprised of a second process fluid and said particulate matter, a method for pre-processing said first descending flow to produce said second descending flow, comprising the steps of
    injecting, in opposition to said first descending flow, a first, ascending, flow comprised of said second process fluid and having an ascending velocity greater than a descending velocity of said first descending flow; and
    removing said ascending flow after said ascending flow contacts said first descending flow;
    wherein, after contact of said first descending flow and said ascending flow, said ascending flow is comprised of said first process fluid and a first portion of said second process fluid and said descending flow is comprised of a second portion of said second process fluid and said particulate matter.

9. The method of claim 8 wherein said particulate matter is spherical-shaped semiconductor material.

10. The method of claim 9 wherein said first process fluid is a first gas and said second process fluid is a second gas.

11. The method of claim 8 and further comprising the step of injecting, into said second descending flow, a second flow of said second process fluid.

12. The method of claim 11 wherein said second flow of said second process fluid injected into said second descending flow is evenly distributed along a periphery of said descending flow.

13. The method of claim 12 wherein said particulate matter is spherical-shaped semiconductor material, said first fluid is a first gas and said second fluid is a second gas.

14. The method of claim 13 wherein said manufacturing system further comprises a second processing station and further comprising the step of generating, as an output of said second processing sation, said first descending flow.

15. The method of claim 1 wherein the step of injecting utilizes a first input and the step of removing utilizes a first output, and wherein the first input is above the first output.

* * * * *